US 6,977,410 B2

(12) United States Patent
Naso et al.

(10) Patent No.: US 6,977,410 B2
(45) Date of Patent: Dec. 20, 2005

(54) TEST MODE DECODER IN A FLASH MEMORY

(75) Inventors: Giovanni Naso, Frosinone (IT); Elio D'Ambrosio, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/880,894

(22) Filed: Jun. 30, 2004

(65) Prior Publication Data

US 2004/0246773 A1 Dec. 9, 2004

Related U.S. Application Data

(62) Division of application No. 10/192,334, filed on Jul. 10, 2002, now Pat. No. 6,785,162.

(30) Foreign Application Priority Data

Sep. 12, 2001 (IT) .................................. RM2001A0556

(51) Int. Cl.[7] ............................................ H01L 29/788
(52) U.S. Cl. ................ 257/316; 365/149; 365/185.08; 365/185.25; 365/185.26; 365/185.33
(58) Field of Search ........................... 365/149, 185.08, 365/185.25, 185.26, 185.33

(56) References Cited

U.S. PATENT DOCUMENTS

| 4,460,982 A | 7/1984 | Gee et al. ..................... 365/189 |
| 4,571,704 A | 2/1986 | Bohac, Jr. .................... 365/156 |
| 4,858,185 A | 8/1989 | Kowshik et al. ............. 365/181 |
| 5,031,142 A | 7/1991 | Castro .......................... 365/49 |
| 5,311,470 A | 5/1994 | Atsumi et al. .......... 365/189.05 |
| 5,411,908 A | 5/1995 | Santin et al. ................. 438/263 |
| 5,526,364 A | 6/1996 | Roohparvar ................ 371/22.1 |
| 5,615,159 A | 3/1997 | Roohparvar ................. 365/201 |
| 5,619,453 A | 4/1997 | Roohparvar et al. ... 365/185.33 |
| 5,627,784 A | 5/1997 | Roohparvar ............ 365/189.01 |
| 5,661,690 A | 8/1997 | Roohparvar ................. 365/201 |
| 5,675,540 A | 10/1997 | Roohparvar ........... 365/185.22 |
| 5,677,885 A | 10/1997 | Roohparvar ................ 365/201 |
| 5,734,661 A | 3/1998 | Roberts et al. ............ 371/22.5 |
| 5,757,705 A | 5/1998 | Manning ..................... 365/201 |
| 5,930,188 A | 7/1999 | Roohparvar ................. 365/201 |
| 6,002,623 A | 12/1999 | Stave et al. .................. 365/201 |
| 6,003,149 A | 12/1999 | Nevill et al. ................ 714/718 |
| 6,058,056 A | 5/2000 | Beffa et al. .................. 365/201 |
| 6,141,276 A | 10/2000 | Mullarkey et al. .......... 365/203 |
| 6,161,204 A | 12/2000 | Gans ........................... 714/718 |
| 6,163,863 A | 12/2000 | Schicht ........................ 714/718 |
| 6,169,695 B1 | 1/2001 | Duesman ..................... 365/201 |
| 6,178,532 B1 | 1/2001 | Pierce et al. ................. 714/718 |
| 6,297,998 B1 | 10/2001 | Van de Graaff et al. ..... 365/201 |
| 6,311,299 B1 | 10/2001 | Bunker ........................ 714/719 |
| 6,327,200 B1 | 12/2001 | Casper ......................... 365/201 |
| 6,331,950 B1 | 12/2001 | Kuo et al. .............. 365/185.18 |
| 6,484,278 B1 | 11/2002 | Merritt et al. ............... 714/719 |
| 6,545,925 B2 | 4/2003 | Lee ............................. 365/222 |
| 6,614,689 B2 | 9/2003 | Roohparvar ........... 365/185.22 |
| 6,628,142 B1 | 9/2003 | Marotta et al. ............... 326/83 |
| 6,654,272 B2 | 11/2003 | Santin et al. ................. 365/96 |
| 6,754,108 B2 * | 6/2004 | Forbes ................... 365/185.25 |
| 2002/0122331 A1 | 9/2002 | Santin et al. ........... 365/185.09 |
| 2002/0186049 A1 | 12/2002 | Pistilli et al. ................ 326/107 |
| 2003/0031056 A1 | 2/2003 | Roohparvar ........... 365/185.22 |
| 2003/0062938 A1 | 4/2003 | Piersimoni et al. .......... 327/200 |
| 2003/0063500 A1 | 4/2003 | Naso et al. .................. 365/200 |
| 2003/0117881 A1 | 6/2003 | Johnson et al. ............. 365/233 |

* cited by examiner

Primary Examiner—David Nelms
Assistant Examiner—Mai-Huong Tran
(74) Attorney, Agent, or Firm—Schwegman, Lunberg, Woessner & Kluth, P.A.

(57) ABSTRACT

Embodiments of the present invention include an interface circuit to put an integrated circuit into a test mode and a decoder to decode one or more commands provided to the integrated circuit. The decoder includes sub-circuits, and each sub-circuit has a number of transistors coupled in series. The transistors coupled in series have control gates coupled to a clock signal or one of several inverted or non-inverted command signals representing a command. The control gates in each sub-circuit are coupled such that a unique pattern of the clock signal and the command signals will switch on all of the transistors to decode the command. Each sub-circuit is capable of decoding a single command. The sub-circuits have ratioed logic with more n-channel transistors than p-channel transistors. The decoder may be fabricated with a flexible placement of vias.

20 Claims, 15 Drawing Sheets

TEST MODE DECODER IN A FLASH MEMORY

This application is a Divisional of U.S. application Ser. No. 10/192,334, filed Jul. 10, 2002 now U.S. Pat. No. 6,785,162, which claims priority under 35 U.S.C. 119 from Italian Application No. RM2001A000556 filed Sep. 12, 2001, both of which are incorporated herein by reference.

FIELD OF THE INVENTION

The present invention relates generally to memory devices, and more particularly, to a test mode decoder in a flash memory device.

BACKGROUND

Electrically erasable and programmable read-only memory devices having arrays of what are known as flash cells, also called flash EEPROMs or flash memory devices, are found in a wide variety of electrical devices. A flash memory device is typically formed in an integrated circuit. A conventional flash cell, also called a floating gate transistor memory cell, is similar to a field effect transistor, having a channel region between a source and a drain in a substrate and a control gate over the channel region. In addition the flash cell has a floating gate between the control gate and the channel region. The floating gate is separated from the channel region by a layer of gate oxide, and an inter-poly dielectric layer separates the control gate from the floating gate. Both the control gate and the floating gate are formed of doped polysilicon. The floating gate is floating or electrically isolated. The flash memory device has a large number of flash cells in an array where the control gate of each flash cell is connected to a word line and the drain is connected to a bit line, the flash cells being arranged in a grid of word lines and bit lines.

A flash cell is programmed by applying approximately 10 volts to the control gate, between 5 and 7 volts to the drain, and grounding the source and the substrate to induce hot electron injection from the channel region to the floating gate through the gate oxide. The voltage at the control gate determines the amount of charge residing on the floating gate after programming. The charge affects current in the channel region by determining the voltage that must be applied to the control gate in order to allow the flash cell to conduct current between the source and the drain. This voltage is termed the threshold voltage of the flash cell, and is the physical form of the data stored in the flash cell. As the charge on the floating gate increases the threshold voltage increases.

One type of flash memory device includes an array of multi-bit or multi-state flash cells. Multi-state flash cells have the same structure as ordinary flash cells and are capable of storing multiple bits of data in a single cell. A multi-bit or multi-state flash cell has multiple distinct threshold voltage levels over a voltage range. Each distinct threshold voltage level corresponds to a set of data bits, with the number of bits representing the amount of data which can be stored in the multi-state flash cell.

Data is stored in conventional flash memory devices by programming flash cells that have been previously erased. A flash cell is erased by applying approximately −10 volts to the control gate, 5 volts to the source, grounding the substrate and allowing the drain to float. In an alternate method of erasure the control gate is grounded and 12 volts is applied to the source. The electrons in the floating gate are induced to pass through the gate oxide to the source by Fowler-Nordheim tunneling such that the charge in the floating gate is reduced and the threshold voltage of the flash cell is reduced. Flash cells in an array in a flash memory device are grouped into blocks, and the cells in each block are erased together.

A flash cell is read by applying approximately 5 volts to the control gate, approximately 1 volt to the drain, and grounding the source and the substrate. The flash cell is rendered conductive and current between the source and the drain is sensed to determine data stored in the flash cell. The current is converted to a voltage that is compared with one or more reference voltages in a sense amplifier to determine the state of the flash cell. The current drawn by a flash cell being read depends on the amount of charge stored in the floating gate.

A flash memory device is fabricated as an integrated circuit and then tested before being operated commercially by a user. Each flash memory device is slightly different from others of the same design because of the unique process conditions of its fabrication and other factors. As a result, each flash memory device has operating characteristics that are slightly different from the characteristics of other flash memory devices. For example, the flash cells of the flash memory device may be programmed at slightly lower control gate voltages than other flash cells.

Programmable control parameters have been used to control the operation of a flash memory device, and the control parameters can be programmed into data storage units after a flash memory device has been fabricated. The control parameters have been used to determine operating parameters for a flash memory device to compensate for its unique operating characteristics determined during fabrication, and the use of control parameters improves its performance. The control parameters are programmed in a test mode of operation following fabrication. The flash memory device is subject to a series of tests during the test mode, and the control parameters are programmed to set operating parameters such as reference voltage levels and the magnitude and duration of voltage pulses.

The control parameters can also be programmed to select operating modes and a configuration for the flash memory device. A wide variety of flash memory devices are used in electronic devices, and different flash memory devices have different configurations and different operating modes depending on the application. The control parameters make it possible to fabricate flash memory devices according to a single design, and then customize the configuration and operating modes of each individual flash memory device according to its application. Each flash memory device can be customized by programming its control parameters during the test mode.

A flash memory device is operated in the test mode in response to specific signals that are decoded by a test mode decoder circuit in the flash memory device. The purpose of the test mode decoder circuit is to start the test mode in response to the appropriate signals, and to prevent the flash memory device from entering the test mode if the appropriate signals are not present. The test mode decoder circuit is a safety device that reduces the likelihood that the control parameters will be changed by accident or mishap. An unwanted change in the control parameters can disable the flash memory device in its application.

The capacity of flash memory devices to store data is gradually being increased by reducing the size and increasing the number of flash cells in each integrated circuit. Other components, including the test mode decoder circuit, must also be reduced in size in order to improve the capacity of flash memory devices. There remains a need for a test mode decoder circuit that is smaller than conventional circuits.

SUMMARY OF THE INVENTION

The above mentioned and other deficiencies are addressed in the following detailed description. Embodiments of the present invention include an interface circuit to put an integrated circuit into a test mode and a decoder to decode one or more commands provided to the integrated circuit. The decoder includes sub-circuits, and each sub-circuit has a number of transistors coupled in series. The transistors coupled in series have control gates coupled to a clock signal or one of several inverted or non-inverted command signals representing a command. The control gates in each sub-circuit are coupled such that a unique pattern of the clock signal and the command signals will switch on all of the transistors to decode the command. Each sub-circuit is capable of decoding a single command. The sub-circuits have ratioed logic with more n-channel transistors than p-channel transistors to reduce the size of the decoder. The decoder may be fabricated with a flexible placement of vias that gives the decoder the flexibility to be fabricated for a variety of applications and to decode a variety of commands.

Advantages of the present invention will be apparent to one skilled in the art upon an examination of the detailed description.

DETAILED DESCRIPTION

Figure 1:
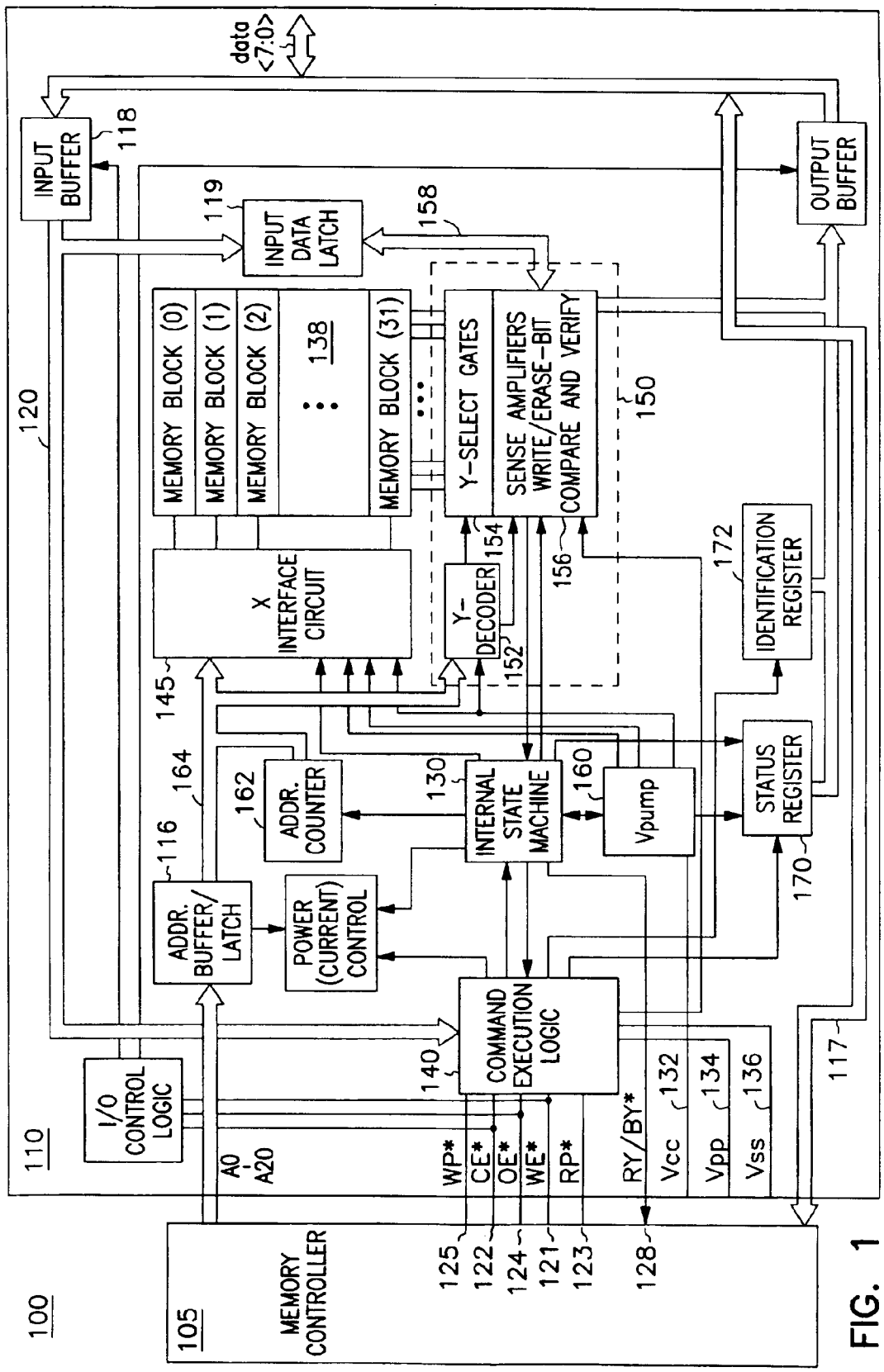
FIG. 1 is a block diagram of a flash memory system according to an embodiment of the present invention.

In the following detailed description of exemplary embodiments of the present invention, reference is made to the accompanying drawings which form a part hereof, and in which are shown by way of illustration specific exemplary embodiments in which the present invention may be practiced. These embodiments are described in sufficient detail to enable those skilled in the art to practice the present invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the claims.

In this description, a threshold voltage of a transistor is the voltage that must be applied to a control gate of the transistor in order to allow the transistor to conduct current between a source and a drain. In this description, a transistor or a flash cell is described as being activated or switched on when it is rendered conductive by a control gate voltage that exceeds its threshold voltage, and the transistor or flash cell is described as being in an inactive state or switched off when the control gate voltage is below the threshold voltage and the transistor or flash cell is non-conductive. A digital signal of 1 may also be called a high signal and a digital signal of 0 may also be called a low signal. A grouping of lines will be represented symbolically by <x:y>, while a single line from that group will be represented as [x].

The terms wafer and substrate may be used in the following description and include any structure having an exposed surface with which to form an integrated circuit (IC) according to embodiments of the present invention. The term substrate is understood to include semiconductor wafers. The term substrate is also used to refer to semiconductor structures during fabrication, and may include other layers that have been fabricated thereupon. The term substrate includes doped and undoped semiconductors, epitaxial semiconductor layers supported by a base semiconductor, or semiconductor layers supported by an insulator, as well as other semiconductor structures well known to one skilled in the art. The term insulator is defined to include any material that is less electrically conductive than materials generally referred to as conductors by those skilled in the art.

The term "horizontal" as used in this application is defined as a plane substantially parallel to the conventional plane or surface of a wafer or substrate, regardless of the orientation of the wafer or substrate. The term "vertical" refers to a direction substantially perpendicular to the horizonal as defined above. Prepositions, such as "on," "upper," "side" (as in "sidewall"), "higher," "lower," "over" and "under" are defined with respect to the conventional plane or surface being on the top surface of the wafer or substrate, regardless of the orientation of the wafer or substrate.

The term "source/drain" refers generally to the terminals or diffusion regions of a field effect transistor. A terminal or a diffusion region may be more specifically described as a "source" or a "drain" on the basis of a voltage applied to it when the field effect transistor is in operation.

P-type conductivity is conductivity associated with holes in a semiconductor material, and n-type conductivity is conductivity associated with electrons in a semiconductor material. Throughout this specification the designation "n+" refers to semiconductor material that is heavily doped n-type semiconductor material, e.g., monocrystalline silicon or polycrystalline silicon. Similarly, the designation "p+"

refers to semiconductor material that is heavily doped p-type semiconductor material. The designations "n–" and "p–" refer to lightly doped n and p-type semiconductor materials, respectively.

A diffusion region in a substrate described herein according to embodiments of the present invention may also be called a moat or a well or a tank. The diffusion region may be an n-type diffusion region or a p-type diffusion region, and the substrate may be a silicon substrate. Transistors and other devices described herein according to embodiments of the present invention may have moats or wells that may be formed in other moats or wells or tanks rather than substrates. Such moats or wells or tanks may be situated with other moats or wells or tanks, or within other moats or wells or tanks, in a larger substrate. The moats or wells or tanks may also be situated in a silicon-on-insulator (SOI) device.

FIG. 1 is a block diagram of a flash memory system 100 according to an embodiment of the present invention. The memory system 100 includes a memory controller 105 and a flash memory integrated circuit (IC) 110. The controller 105 includes a control device such as a microprocessor to provide interface signals to the IC 110. The interface signals include address signals provided over multiple address lines A0–A20 to an address buffer and latch 116, and data signals communicated over multiple data lines data <7:0>. The IC 110 has more than 21 address lines, and more than 8 data lines in alternate embodiments of the present invention. The data lines data <7:0> comprise 8 separate conductive lines each capable of transmitting a voltage signal, and together the data lines data <7:0> may comprise a lower byte of a data bus. The data lines data <7:0> are coupled to an input buffer 118 which stores the data signals for transfer to an input data latch 119 over multiple internal data lines 120. Other interface signals provided by the controller 105 include a write enable signal WE* at node 121, a chip enable signal CE* at node 122, a reset/power-down signal RP* at node 123, an output enable signal OE* at node 124, and a write protect signal WP* at node 125, all of which are active low signals. The IC 110 provides a status signal RY/BY* to the controller 105 at node 128 to indicate the status of an internal state machine 130. The IC 110 also receives a positive power supply voltage $V_{CC}$ at node 132, a write/erase supply or programming voltage $V_{pp}$ at node 134, and a reference voltage such as a substrate ground voltage $V_{SS}$ at node 136 which is approximately 0 Volts. Each of the address lines A0–A20, data lines data <7:0>, and nodes 121–128 is terminated at a pin (not shown) in the IC 110 that may be coupled to the controller 105 by a line such as a control line.

The IC 110 includes an array 138 of floating gate transistor memory cells or flash cells arranged in 32 flash cell blocks. Each block in the array 138 contains 64 kilobytes of flash cells. Flash cells in each block are erased as a group at the same time. A command execution logic module 140 receives the above-described interface signals from the controller 105. The module 140 controls the state machine 130 which controls individual acts necessary for programming, reading, and erasing the flash cells in the array 138. More specifically the state machine 130 controls detailed operations of the IC 110 such as providing write and block erase timing sequences to the array 138 through an X-interface circuit 145 and a Y-interface circuit 150.

The Y-interface circuit 150 provides access to individual flash cells through data lines in the array 138. Data lines in the Y-interface circuit 150 are connected to a bit line driver circuit (not shown). The Y-interface circuit 150 includes a Y-decoder circuit 152, Y-select gates 154, and sense amplifiers and write/erase bit compare and verify circuits 156. The X-interface circuit 145 provides access to rows of flash cells through word lines in the array 138, which are electrically coupled to the control gates of the flash cells in the array 138. The X-interface circuit 145 includes decoding and control circuits for erasing the blocks of flash cells in the array 138. The write/erase bit compare and verify circuits 156 are coupled to exchange data with the input data latch 119 over a set of internal data lines 158.

The IC 110 includes a charge pump circuit 160 to generate an elevated voltage Vpump for programming, erasing, or reading the flash cells in the array 138. The pump circuit 160 is coupled to receive the positive power supply voltage $V_{CC}$ from the node 132 and provides the voltage Vpump to the X-interface circuit 145, the Y-decoder circuit 152, and the state machine 130 over a plurality of lines. In an alternate embodiment of the present invention, the pump circuit 160 may provide a different elevated voltage over each of the lines shown in FIG. 1. The state machine 130 controls an address counter 162 which is capable of providing a sequence of addresses on an internal set of address lines 164 coupled between the address buffer and latch 116, the X-interface circuit 145, and the Y-decoder circuit 152.

The IC 100 also includes a status register 170 coupled to receive signals from the state machine 130, the module 140, and the pump circuit 160. Bits in the status register 170 indicate the status of the IC 110, and the status register 170 is read by the controller 105. The IC 110 also includes an identification register 172 coupled to receive signals from the module 140.

Figure 2:
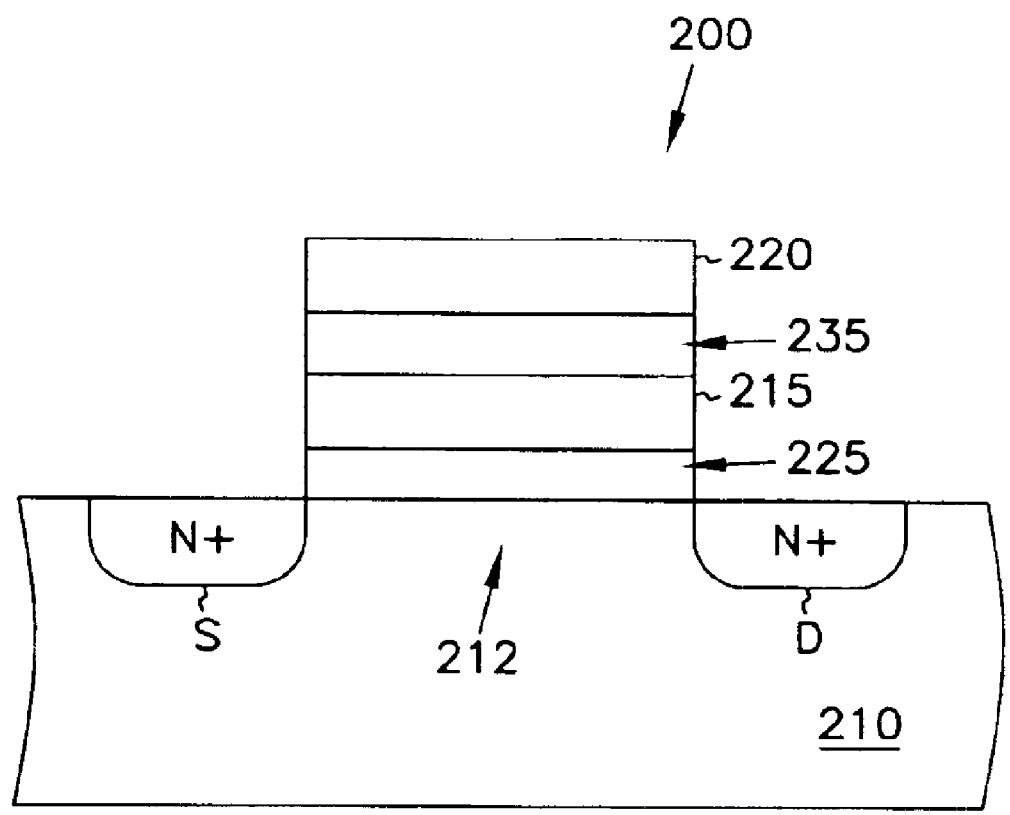
FIG. 2 is a cross-sectional view of a flash cell according to an embodiment of the present invention.

A cross-sectional view of a flash cell 200 is shown in FIG. 2 according to an embodiment of the present invention. The flash cell 200 includes an n+-type source S and an n+-type drain D formed in a p-type silicon substrate 210. The source S and the drain D are separated by a channel region 212 in the substrate 210. The flash cell 200 includes a floating gate 215 and a control gate 220, both formed of doped polysilicon. The floating gate 215 is floating or electrically isolated. A layer of gate oxide 225 separates the floating gate 215 from the channel region 212 in the substrate 210. An inter-poly dielectric layer 235 separates the floating gate 215 from the control gate 220. The substrate 210 may be silicon or another semiconductor material, or it may be a thin semiconductor surface layer formed on an underlying insulating portion, such as a semiconductor-on-insulator (SOI) structure or other thin film transistor technology. The source S and the drain D are formed by conventional complementary metal-oxide-semiconductor (CMOS) processing techniques.

The flash cell 200 shown in FIG. 2 is an n-channel floating gate transistor memory cell. In another embodiment of the present invention, the flash cell 200 may be a p-channel floating gate transistor memory cell with a p+-type source S and a p+-type drain D formed in an n-type silicon substrate 210.

Figure 3:
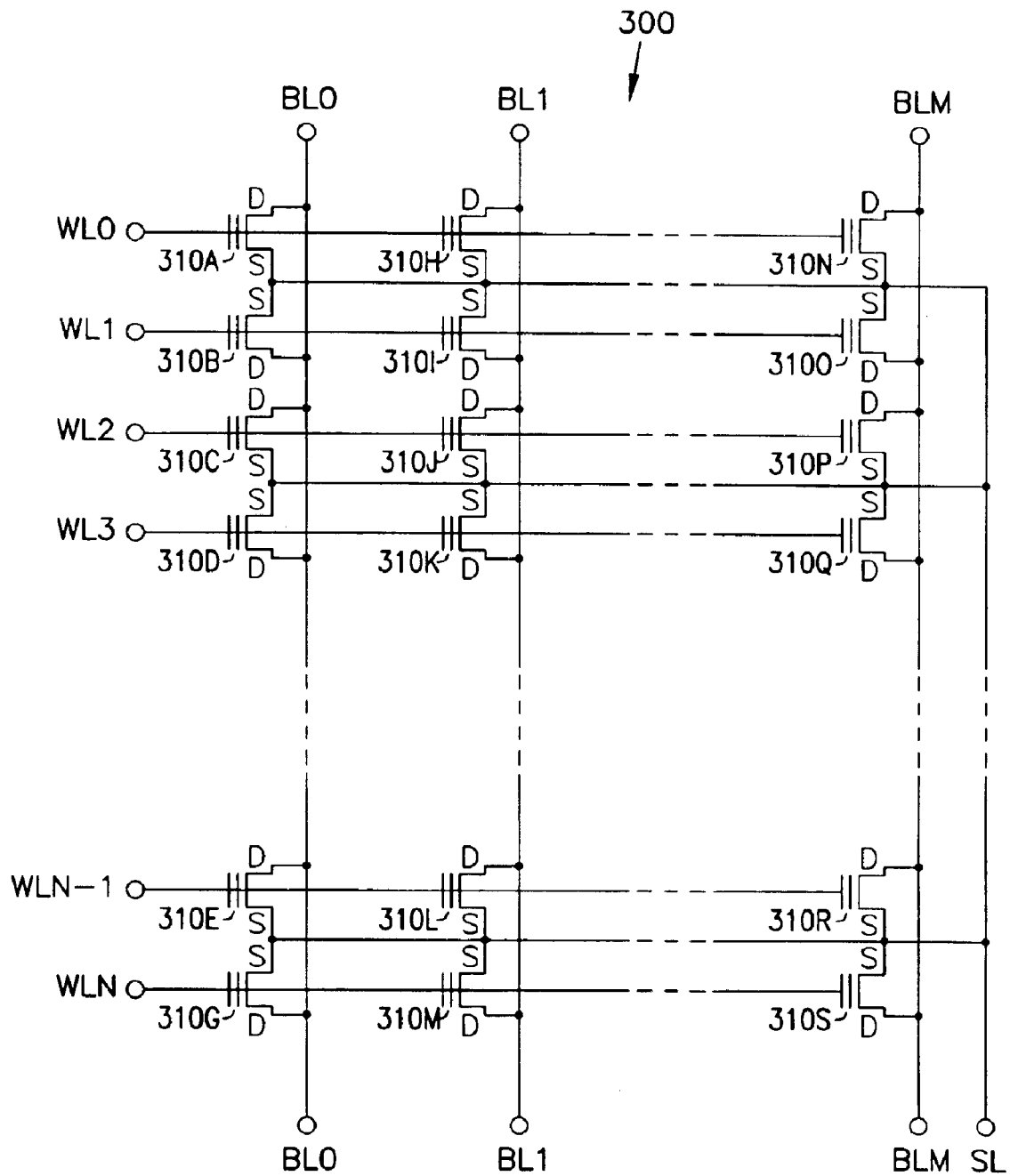
FIG. 3 is an electrical schematic diagram of a block of flash cells in the memory system of FIG. 1.

FIG. 3 is an electrical schematic diagram of a block 300 of flash cells 310A–310S in the array 138 according to an embodiment of the present invention. Some flash cells in the block 300 are omitted from FIG. 3 for purposes of clarity. The flash cells 310 are arranged in rows and columns. All of the flash cells 310 in a particular column have drains D connected to a common bit line BL and all of the flash cells 310 in a particular row have control gates connected to a common word line WL. The bit lines BL are identified as BL0–BLM and the word lines WL are identified as WL0–WLN. All of the flash cells 310 in the block 300 have sources S connected to a common source line SL. The remaining flash cells in the array 138 are arranged into separate blocks having separate source lines. The flash cells in different blocks are erased independently to reduce the required erase current. There may be more or less flash cells 310 in the block 300, and in the array 138, according to alternate embodiments of the present invention.

The flash cells 310 are arranged in column pairs, with each flash cell 310 of the pair sharing a common source S. For example, a flash cell pair 310J and 310K have a common source S connected to the source line SL. The drains D of the flash cells 310 are connected to the bit line BL associated with the column in which the flash cells 310 are located. For example, the flash cell pair 310J and 310K have their drains D connected to a common bit line BL1.

A selected one of the flash cells 310A–310S in the block 300 is programmed by holding the source line SL to the ground voltage $V_{SS}$ or zero volts, coupling approximately 5–7 volts to the bit line BL connected to the flash cell, and applying a high positive voltage programming pulse of approximately 10 volts to the word line WL of the flash cell. A selected one of the flash cells 310A–310S in the block 300 is read by holding the source line SL to the ground voltage $V_{SS}$, coupling approximately 1 volt to the bit line BL connected to the flash cell, applying approximately 5.4 volts to the word line WL of the flash cell, and sensing current in the flash cell through the bit line BL. The current is sensed by one of the sense amplifiers 156 that is coupled to the bit line BL. The sensed current is inversely related to the threshold voltage of the flash cell. The higher the threshold voltage, the less current is sensed in the flash cell, and visa versa. The flash cells 310A–310S in the block 300 are erased by holding the word lines WL0–WLN to the ground voltage $V_{SS}$, allowing the bit lines BL0–BLM to float, and applying a high positive voltage erase pulse of approximately 12 volts to the sources S through the source line SL. Charge is removed from the floating gate of the flash cell when it is erased.

Control parameters for the IC 110 are programmed by being stored in non-volatile data storage units in the IC 110 in a test mode of operation after it has been fabricated. The data storage units may comprise flash cells or latches, or a combination thereof. The control parameters determine operating parameters for the IC 110 such as, for example, supply voltage levels, reference voltage levels, the magnitude and duration of voltage pulses. More specifically, control parameters may determine the magnitude and duration of programming pulses, heal pulses, and erase pulses for flash cells in the IC 110. The control parameters may select a bus size for the IC 110 to determine the length of words stored in the array 138. The control parameters may determine other operating parameters such as choosing bottom addressing or top addressing for the IC 110. The control parameters may also determine the configuration of the IC 100 by enabling selected circuits and/or disabling other circuits.

Figure 4:
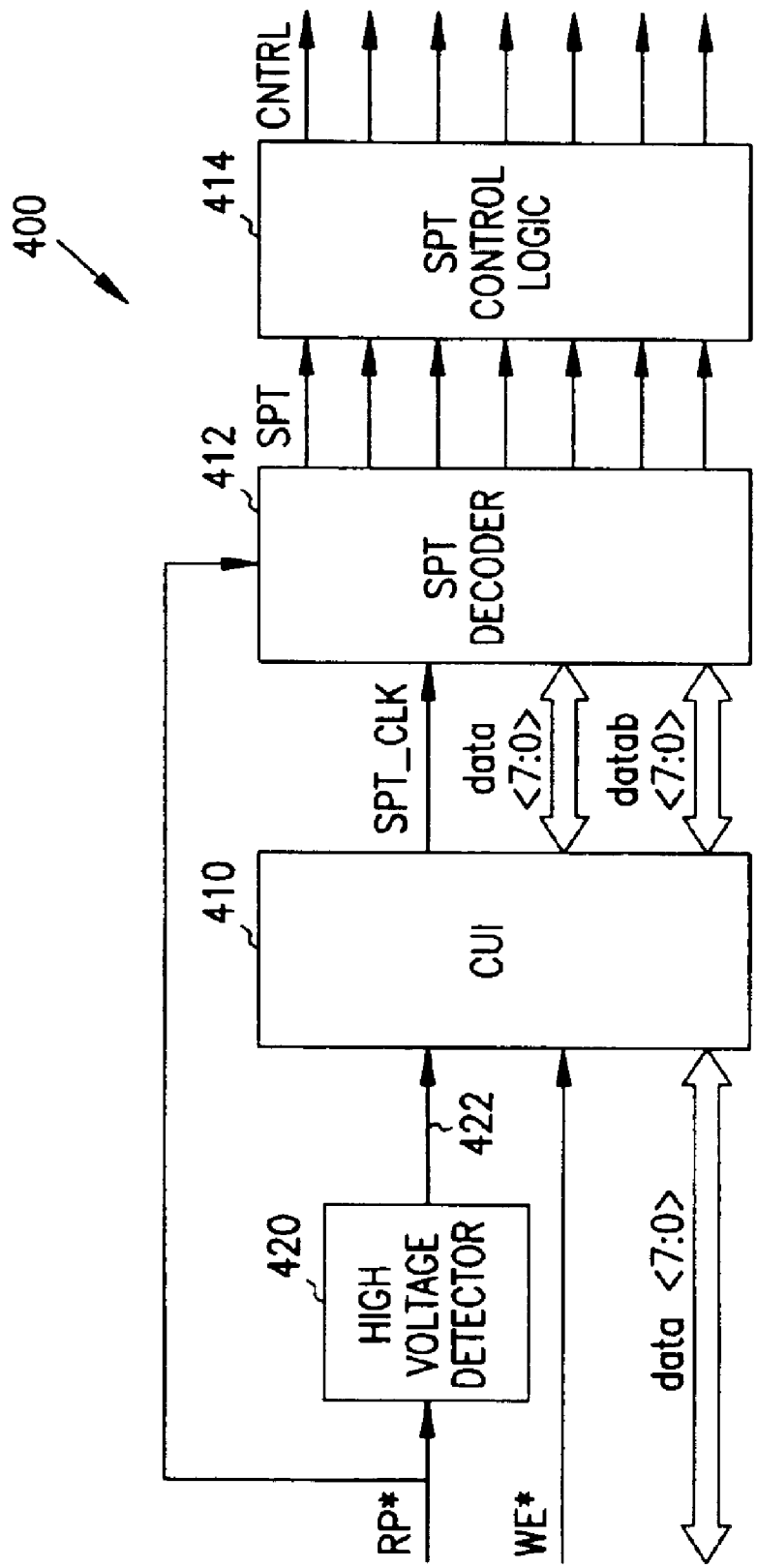
FIG. 4 is a block diagram of a test mode decoder circuit according to an embodiment of the present invention.

The IC 110 is operated in the test mode in response to specific signals that are decoded by a test mode decoder 400 circuit in the IC 110. A block diagram of the test mode decoder 400 is shown in FIG. 4 according to an embodiment of the present invention. The test mode decoder 400 includes a command user interface (CUI) 410 circuit, an SPT decoder 412 circuit, and an SPT control logic 414 circuit. The write enable signal WE* and the data lines data <7:0> are coupled to the CUI 410, and the reset/power-down signal RP* is coupled to the SPT decoder 412 and to a high voltage detector circuit 420. The CUI 410 decodes user commands supplied on the data lines data <7:0> during various modes of operation of the IC 110. The IC 110 is placed in the test mode of operation to program control parameters in the IC 110, as well as for other events. The CUI 410 places the IC 110 in the test mode of operation in response to the write enable signal WE*, the reset/power-down signal RP*, and specific commands on the data lines data <7:0> as will be described with reference to a timing diagram 500 of signals shown in FIG. 5 according to an embodiment of the present invention.

Figure 5:
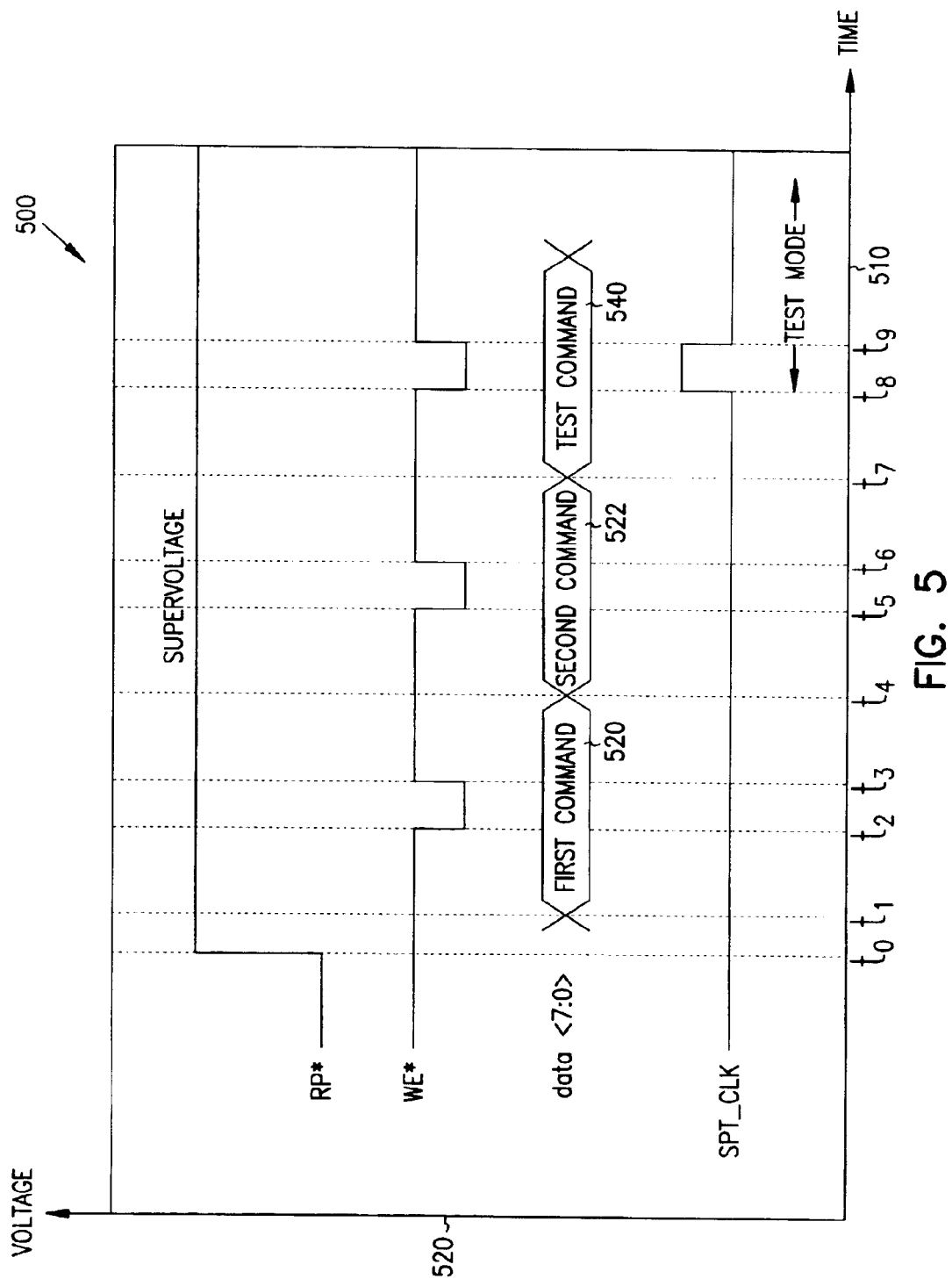
FIG. 5 is a timing diagram of signals according to an embodiment of the present invention.

The timing diagram 500 shows time on a horizontal axis 510 and a voltage level of various signals along a vertical axis 520. The test mode of operation may be entered only when the reset/power-down signal RP* is at a supervoltage that is higher than voltages present in the IC 110 during modes of operation other than the test mode of operation. The level of the reset/power-down signal RP* is detected by the high voltage detector circuit 420 which couples a signal 422 to the CUI 410 when the reset/power-down signal RP* reaches or exceeds the supervoltage. In FIG. 5, the reset/power-down signal RP* is at a supervoltage after time $t_0$. In addition, the CUI 410 places the IC 110 in the test mode of operation only after receiving and decoding two specific commands, a first command 520 and a second command 522, in a sequence from the data lines data <7:0>. The first command 520 and the second command 522 are decoded during successive pulses of the write enable signal WE*. For example, the first command 520 is decoded between $t_2$ and $t_3$ and the second command 522 is decoded between $t_5$ and $t_6$. If the CUI 410 accepts and decodes the commands 520 and 522, and the reset/power-down signal RP* is at the supervoltage, the IC 110 is in the test mode of operation, and the CUI 410 begins to generate an SPT clock signal SPT_CLK that is coupled to the SPT decoder 412. The SPT clock signal SPT_CLK is a high pulse signal that is coincident with pulses of the write enable signal WE*. A first SPT_CLK pulse is shown between $t_g$ and $t_9$. The SPT clock signal SPT_CLK pulse can be widened or narrowed by changing the pulse of the write enable signal WE*. The SPT clock signal SPT_CLK pulse enables the SPT decoder 412 as will be further described hereinbelow.

Two sets of data lines are coupled between the CUI 410 and the SPT decoder 412, the data lines data <7:0> and a second set of data lines datab <7:0>. The data lines datab <7:0> carry signals that are the inverse of the signals carried on the data lines data <7:0>. The CUI 410 inverts commands on the data lines data <7:0> and sends them to the SPT decoder 412 on the data lines datab <7:0>. The SPT decoder 412 uses signals from both of the sets of data lines data <7:0> and datab <7:0> to decode test commands.

A test command 540 is received from the data lines data <7:0> following the second command 522, and is coupled to the SPT decoder 412 on the data lines data <7:0> along with an inverted version of the test command 540 on the data lines datab <7:0>. The test command 540 will initiate a particular operation on the IC 110, such as programming a control parameter in the IC 110. The test command 540 is decoded by the SPT decoder 412 during the first SPT_CLK pulse between $t_g$ and $t_9$, and the SPT decoder 412 generates an SPT signal on one of a plurality of SPT lines that are coupled to the SPT control logic 414. The SPT control logic 414 generates a series of control signals on a set of control lines CNTRL that are coupled to portions of the IC 110 to carry out the test command 540. The test mode continues and successive test commands are decoded by the SPT decoder 412 on successive pulses of the SPT clock signal SPT_CLK until the reset/power-down signal RP* falls below the supervoltage as detected by the high voltage detector circuit 420, or a command on the data lines data <7:0> controls the CUI 410 to end the test mode. At the end of the test mode the CUI 410 ceases to generate the SPT clock signal SPT_CLK to disable the SPT decoder 412.

Figure 6:
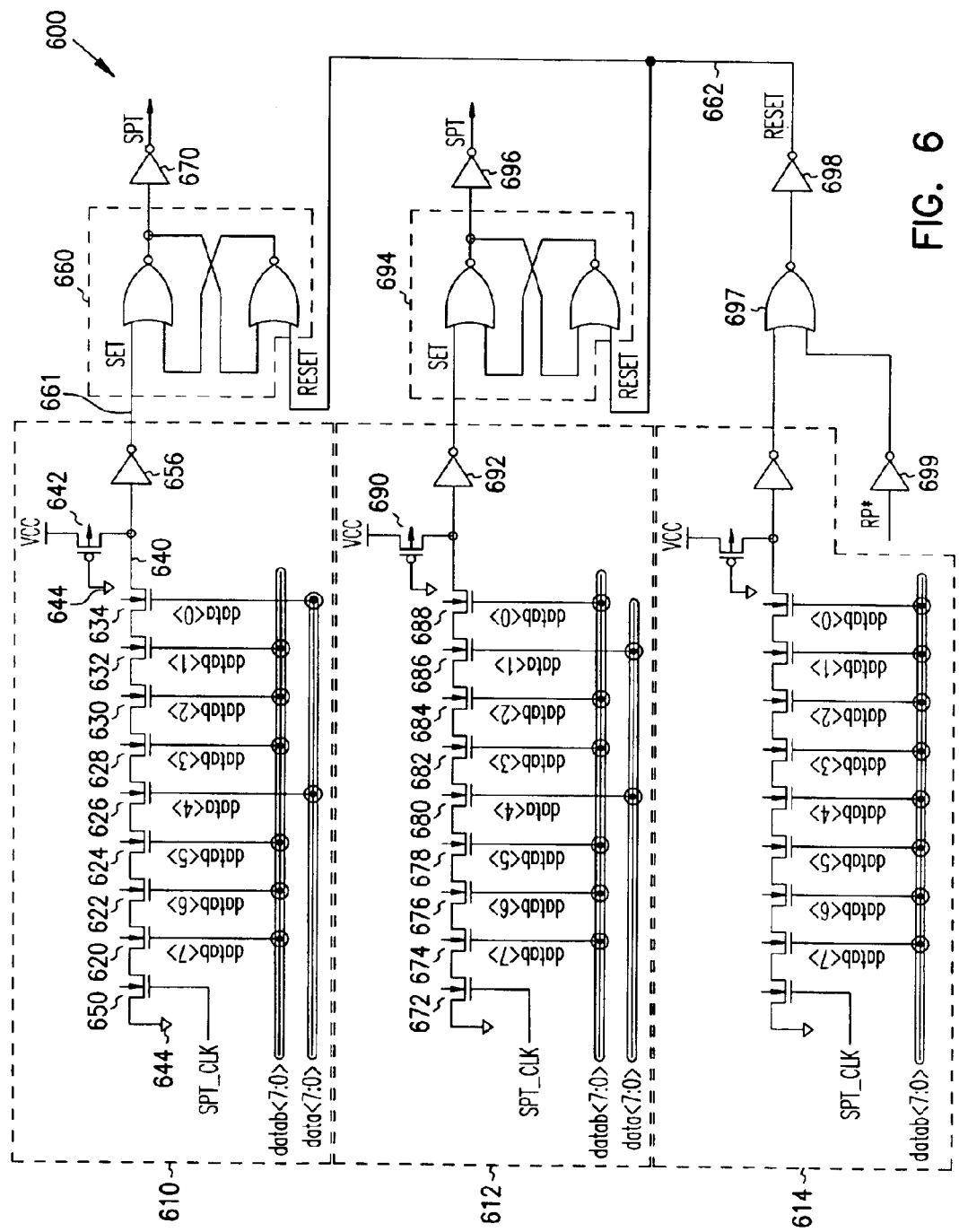
FIG. 6 is an electrical schematic diagram of a decoder circuit according to an embodiment of the present invention.

An electrical schematic diagram of an SPT decoder 600 circuit is shown in FIG. 6 according to an embodiment of the present invention. The SPT decoder 600 may comprise the SPT decoder 412 shown in FIG. 4. The SPT decoder 600 includes three decoding sub-circuits 610, 612, and 614. Each of the decoding sub-circuits 610, 612, and 614 has a substantially similar structure, and operates in a substantially similar manner, so only the decoding sub-circuit 610 will be described in detail for purposes of brevity.

A test command on the data lines data <7:0> is decoded by 8 n-channel transistors 620, 622, 624, 626, 628, 630, 632, and 634 coupled in series in the sub-circuit 610, each of the n-channel transistors 620–634 having a source/drain diffusion region coupled to a source/drain diffusion region of an adjacent one of the n-channel transistors 620–634. The source/drain diffusion regions of the n-channel transistors 620–634 comprise an electrically coupled line 640 that is conductive when all of the n-channel transistors 620–634 are switched on and the coupled line 640 carries a signal representing the decoded test command. The coupled line 640 is coupled to the supply voltage $V_{CC}$ through a p-channel transistor 642 having a control gate coupled to the ground voltage $V_{SS}$ 644. The sub-circuit 610 is enabled by an n-channel transistor 650 having source/drain diffusion regions coupled between a source/drain diffusion region of the transistor 620 and the ground voltage $V_{SS}$ 644. A control gate of the transistor 650 is coupled to receive the SPT clock signal SPT_CLK. A control gate of each one of the n-channel transistors 620–634 is connected to one line of the data lines data <7:0> and datab <7:0>. In alternate embodiments of the present invention, there may be more or less than 8 data lines carrying the test command, and more or less than 9 n-channel transistors in the subcircuits 610, 612, and 614.

The coupled line 640 carries a voltage signal indicating whether the sub-circuit 610 has decoded a test command on the data lines data <7:0>, and this signal is inverted by an inverter 656 and latched by a flip-flop circuit 660 comprising two cross-coupled NOR gates. The flip-flop circuit 660 receives the inverted signal on a SET line 661 and is reset from a RESET line 662. The flip-flop circuit 660 has an output signal that is inverted by an inverter 670 into an SPT signal.

The sub-circuit 610 decodes a test command on the data lines data <7:0> in the following manner. Most of the time the SPT clock signal SPT_CLK is low such that the transistor 650 is switched off, and the coupled line 640 is charged to a high signal from the supply voltage $V_{CC}$ through the transistor 642 that is switched on by the ground voltage $V_{SS}$ 644. The high signal on the coupled line 640 is inverted by the inverter 656 into a low signal that does not change the state of the flip-flop circuit 660. However, the transistor 650 is switched on during a high pulse of the SPT clock signal SPT_CLK (generated as described above) to couple the n-channel transistors 620–634 to the ground voltage $V_{SS}$ 644. Each of the n-channel transistors 620–634 has a control gate coupled to one of the data lines data <7:0> and datab <7:0>. The data lines data <7:0> carry a command represented by a byte of 8 0's and 1's. Each of the n-channel transistors 620–634 is switched on if its control gate is coupled to a data line carrying a 1. This transistor can be switched on by being coupled to a 1 on a line in the data lines data <7:0>. The transistor can also be switched on by being coupled to a 1 on one of the data lines datab <7:0> that has been inverted from a 0 on the corresponding line in the data lines data <7:0>. The connections of the control gates of the n-channel transistors 620–634 form a pattern that recognizes a specific command on the data lines data <7:0>. If the pattern of connections of the control gates of the n-channel transistors 620–634 is such that the test command on the data lines data <7:0> switches on all of the n-channel transistors 620–634 during the high pulse of the SPT clock signal SPT_CLK, then the coupled line 640 is discharged through the transistor 650 to the ground voltage $V_{SS}$ 644, and goes to a low signal. The low signal on the coupled line 640 is inverted by the inverter 656 to a high signal that sets the output of the flip-flop circuit 660 to a low signal. The low signal is inverted by the inverter 670 to a high SPT signal that is coupled to the SPT control logic 414 to cause the test command to be executed in the IC 110. At the end of the high pulse of the SPT clock signal SPT_CLK, the transistor 650 is switched off and the coupled line 640 is charged again to a high signal from the supply voltage $V_{CC}$ through the transistor 642. The high signal is inverted by the inverter 656 into a low signal that does not change the state of the flip-flop circuit 660. A test command of 00010001 on the data lines data <7:0> is recognized and decoded by the sub-circuit 610, and the receipt of the test command is latched in the flip-flop circuit 660 until the flip-flop circuit 660 is reset.

The sub-circuit 612 has an arrangement of n-channel transistors 672, 674, 676, 678, 680, 682, 684, 686, and 688, a p-channel transistor 690, and an inverter 692 that is substantially the same as the arrangement of elements in the sub-circuit 610, and is similarly coupled to a flip-flop circuit 694 and an inverter 696. However, control gates of the n-channel transistors 674–688 are connected to the data lines data <7:0> and datab <7:0> in a different pattern such that the sub-circuit 612 will recognize and decode a test command of 00010010 on the data lines data <7:0> that is different from the test command recognized by the sub-circuit 610. The sub-circuit 612 will cause its own high SPT signal to be generated from the inverter 696 when it recognizes and decodes its own designated test command.

The sub-circuit 614 has the same arrangement of transistors and inverters as the sub-circuit 610, but control gates of its transistors are connected only to the data lines datab <7:0>. The sub-circuit 614 will generate a high signal to be coupled to an input of a single NOR gate 697 when a test command of only 0's is present on the data lines data <7:0>. The test command of 8 0's indicates that the flip-flop circuits 660 and 694 are to be reset by a high signal on the RESET line 662. The high signal at the input of the NOR gate 697 causes the NOR gate 697 to generate a low signal that is inverted by an inverter 698 to a high signal on the RESET line 662. The high signal on the RESET line 662 causes the SPT signals generated by the flip-flop circuits 660 and 694 and the respective inverters 670 and 696 to go low. The high signal on the RESET line 662 erases the results of the decoded test commands that may have been previously latched by the flip-flop circuits 660 and 694.

An inverter 699 in the SPT decoder 600 has an input coupled to receive the reset/power-down signal RP*. An output of the inverter 699 is coupled to an input of the NOR gate 697 and remains low as long as the reset/power-down signal RP* is high, such as at the supervoltage. However, when the reset/power-down signal RP* goes low the inverter 699 couples a high signal to the input of the NOR gate 697 resulting in a low signal at the input of the inverter 698 and a high signal on the RESET line 662 that resets the flip-flop circuits 660 and 694.

One of the advantages of the SPT decoder 600 is that the test commands that arrive in succession, one after the other, on the data lines data <7:0> are decoded in succession, and the results of the decoded test commands are stored or latched in the flip-flop circuits 660 and 694 until they are reset by a high signal on the RESET line 662. A record of the test commands received so far is thereby stored and made available to the SPT control logic 414 in the form of the high SPT signals. The high SPT signals are available in parallel and concurrently.

Another advantage of the SPT decoder 600 is that there are more n-channel transistors than p-channel transistors in each of the sub-circuits 610, 612, and 614. The sub-circuits 610, 612, and 614 are fabricated with ratioed logic, which is logic that contains a ratio of n-channel transistors to p-channel transistors. The ratioed logic takes up a smaller space in an integrated circuit than logic that contains an equal number of p-channel and n-channel transistors. The SPT decoder 600 is therefore compact.

Figure 7A:
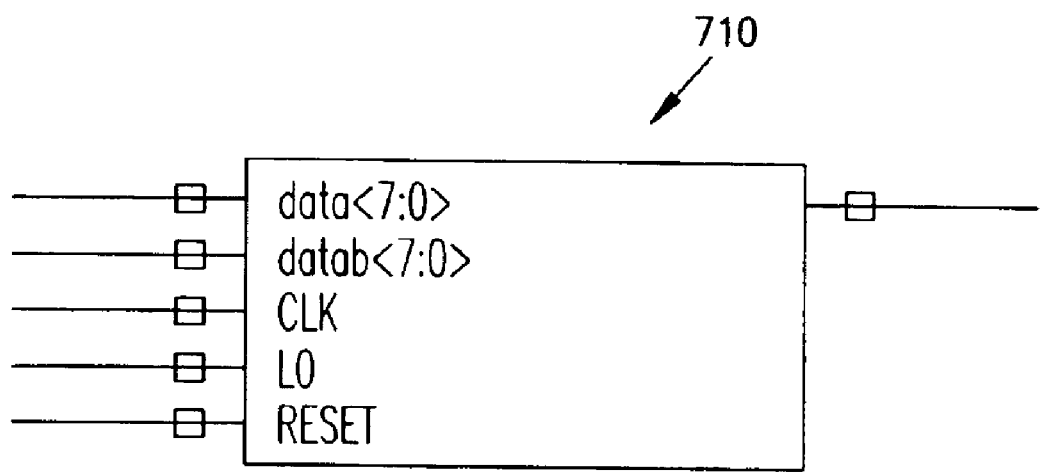
FIG. 7A is a block diagram of a block of sub-circuits according to an embodiment of the present invention.

The SPT decoder 600 may contain more than the three sub-circuits 610, 612, and 614. In fact, the SPT decoder 600 may contain dozens and even hundreds of sub-circuits similar to the sub-circuits 610, 612, and 614 in alternate embodiments of the present invention. There may be as many sub-circuits as there are available test commands in the SPT decoder 600. Some of the sub-circuits may not be used as the design of the SPT decoder 600 is modular and employs a flexible placement of vias as will be described hereinbelow. The flexible placement of vias allow the design of the SPT decoder 600 to be used in a variety of applications that require the decoding of different sets of test commands. The test commands to be decoded are selected by a via mask that is used in the fabrication of the SPT decoder 600 as will be described hereinbelow. The unused sub-circuits are also available during debugging of a device with the SPT decoder 600. Additional tests or functions can be made available by fabricating the same design of the SPT decoder 600 with a new via mask that assigns new test commands to be decoded by the additional sub-circuits. A block 710 of sub-circuits is shown in FIG. 7A according to an embodiment of the present invention. The block 710 may include hundreds of sub-circuits. Each of the sub-circuits in the block 710 is similar to one of the sub-circuits 610, 612, and 614 shown in FIG. 6. Some of the sub-circuits in the block 710 may have vias selected such that they are used to decode different test commands, and others of the sub-circuits may not be used.

Figure 7B:
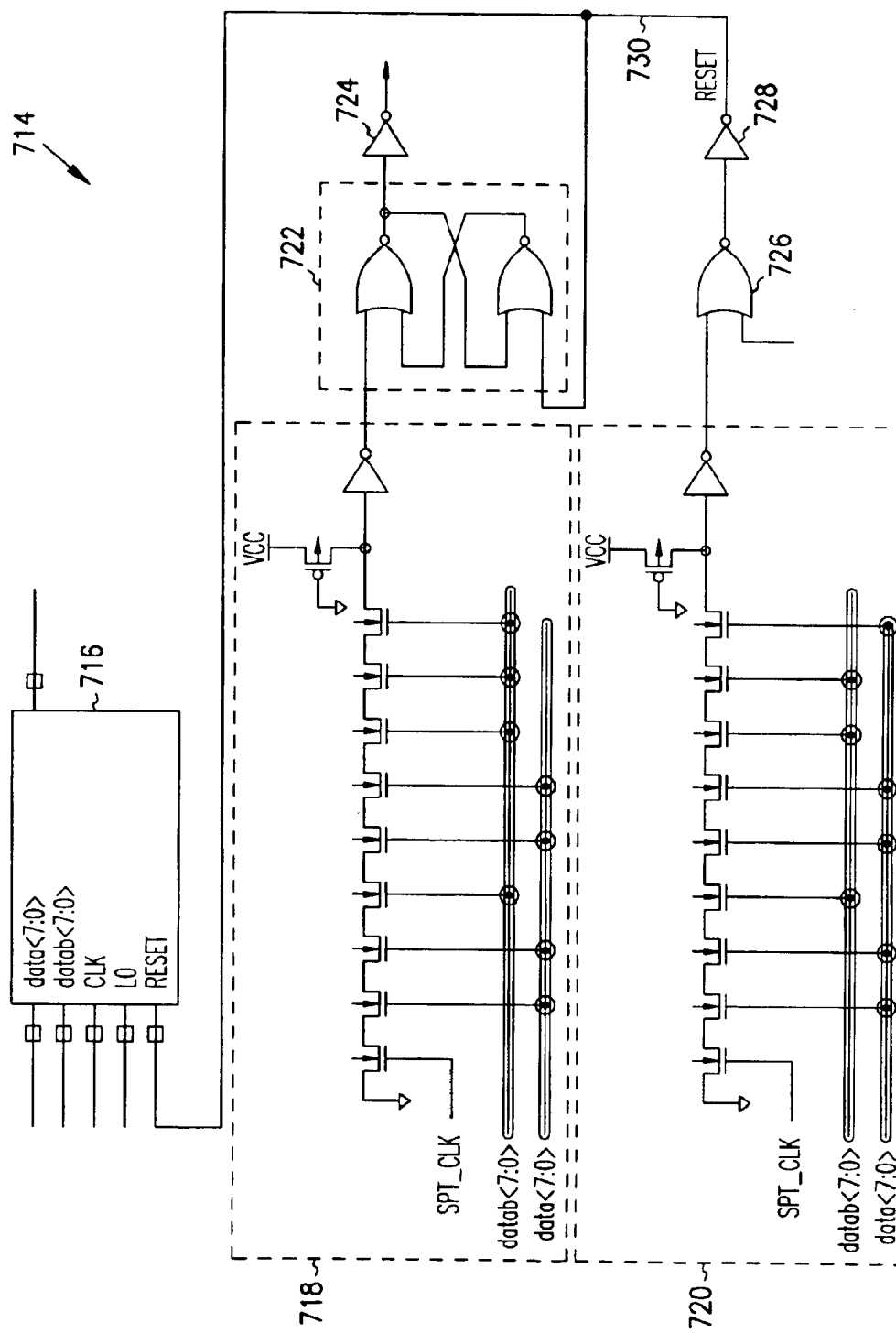
FIG. 7B is an electrical schematic diagram of a decoder circuit according to an embodiment of the present invention.

An electrical schematic diagram of an SPT decoder 714 circuit is shown in FIG. 7B according to an embodiment of the present invention. The SPT decoder 714 includes a block 716 of sub-circuits similar to the block 710 shown in FIG. 7A. A sub-circuit 718 and a sub-circuit 720 are similar to the sub-circuits 610, 612, and 614 shown in FIG. 6. A flip-flop circuit 722 is coupled to the sub-circuit 718 and is similar to the flip-flop circuits 660 and 694 shown in FIG. 6. A NOR gate 726 and an inverter 728 are coupled to the sub-circuit 720 to generate a high signal on a RESET line 730. The NOR gate 726 and the inverter 728 are coupled to the sub-circuit 720 in a manner similar to the coupling of the NOR gate 697 and the inverter 698 shown in FIG. 6. The sub-circuit 720 causes a high signal on the RESET line 730 by decoding a test command 11011001 on the data lines data <7:0>. The high signal on the RESET line 730 resets the flip-flop circuit 722 and flip-flop circuits in the block 716.

Figure 7C:
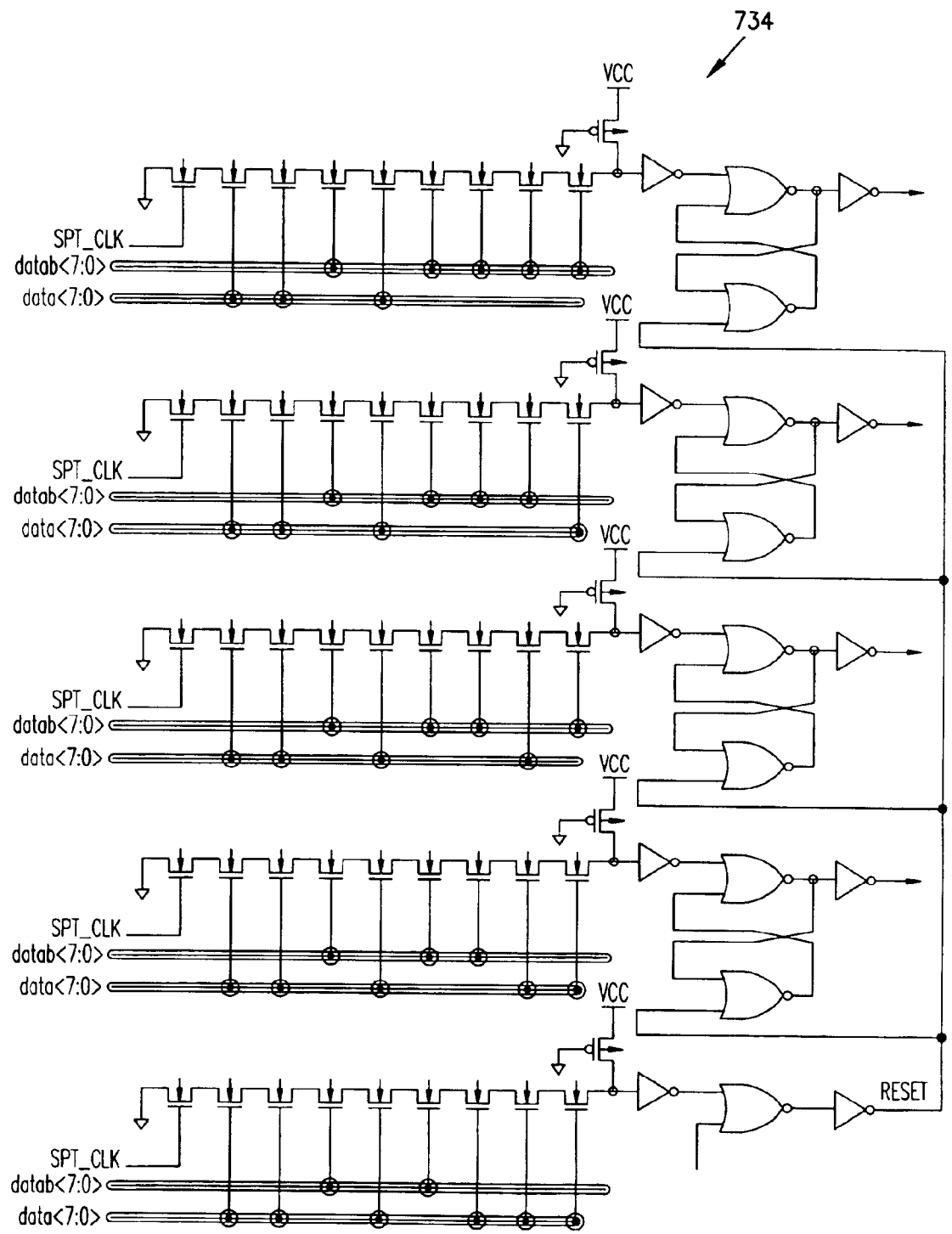
FIG. 7C is an electrical schematic diagram of a decoder circuit according to an embodiment of the present invention.

An electrical schematic diagram of an SPT decoder 734 circuit is shown in FIG. 7C according to an embodiment of the present invention. The SPT decoder 734 is similar to the SPT decoder 600 shown in FIG. 6 and has a similar arrangement of sub-circuits and flip-flop circuits. One difference is that the bottom-most sub-circuit shown in FIG. 7C will decode a test command 11010111 that results in a high signal on a RESET line that resets flip-flop circuits in the SPT decoder 734 coupled to the RESET line.

Figure 7D:
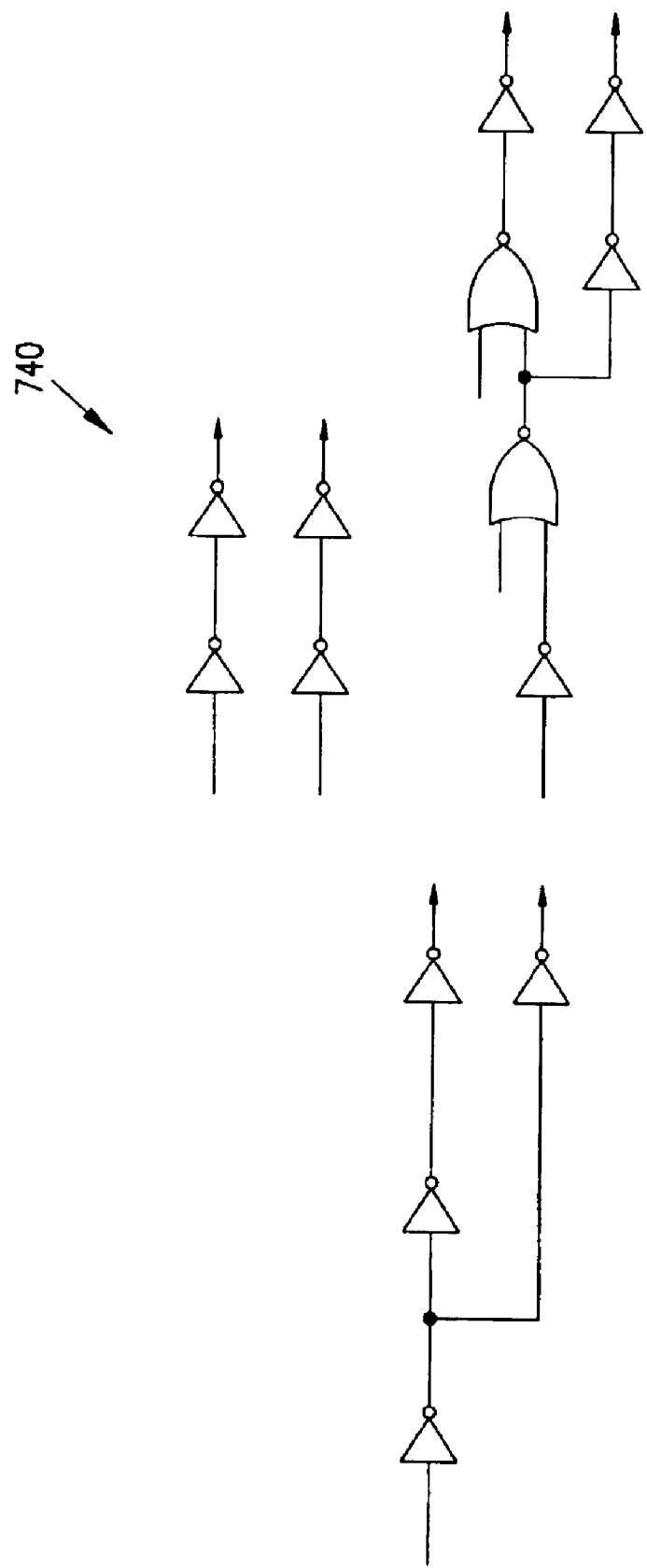
FIG. 7D is an electrical schematic diagram of buffer circuits according to an embodiment of the present invention.

An electrical schematic diagram of buffer circuits 740 are shown in FIG. 7D according to an embodiment of the present invention. The buffer circuits 740 may be used in any one of the SPT decoders 600, 714, and 734 described above. The buffer circuits include inverters and NOR gates.

Figure 8:
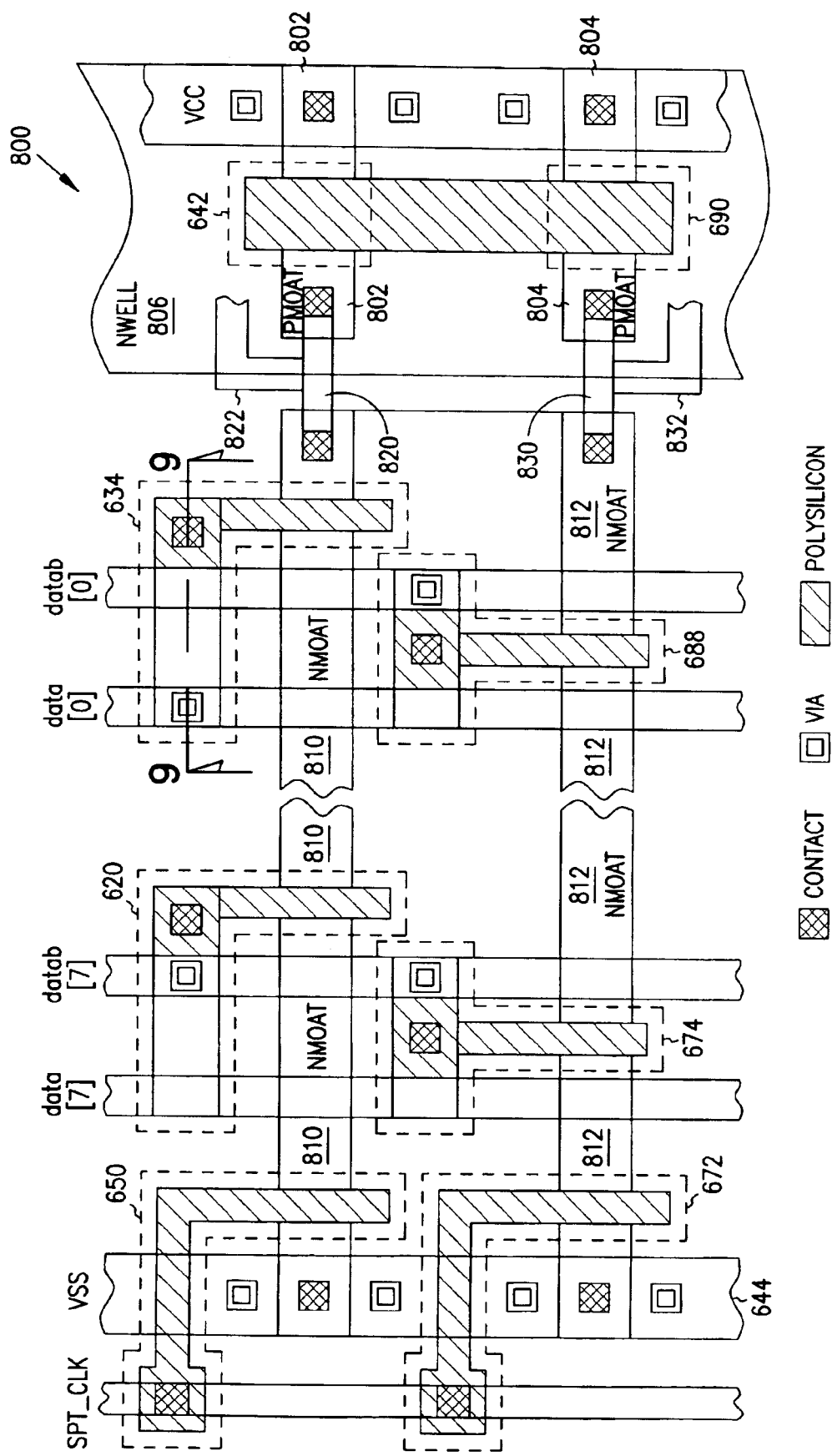
FIG. 8 is a block diagram of a layout of a decoder circuit according to an embodiment of the present invention.

A block diagram 800 of a layout of the SPT decoder 600 is shown in FIG. 8 according to an embodiment of the present invention. Portions of the SPT decoder 600 that were shown in FIG. 6, such as many of the n-channel transistors, are not shown in FIG. 8 for purposes of brevity. Elements and devices that are common to FIG. 6 and FIG. 8 have been given the same reference numerals for purposes of brevity. Several layers of the layout are shown in the block diagram 800 including n-type and p-type diffusion regions, doped polysilicon, two layers of metal, contacts, and vias. Contacts and vias described herein are structures of a conductive material such as metal that are formed in contact with elements in an integrated circuit to couple signals between the elements as is known to those skilled in the art. All of the elements shown in FIG. 8 are formed in or on a p-type silicon substrate. Symbols for a contact, a via, and doped polysilicon are shown at the bottom of FIG. 8 and are followed in FIG. 8 to represent those elements without specific reference numerals.

The transistors 620, 634, 642, 650, 672, 674, 688, and 690 shown in FIG. 6 are also shown in the layout of FIG. 8, outlined by dashed lines. Doped polysilicon is shown as blocks with cross-hatching, and the control gates of the respective transistors may comprise a doped polysilicon gate or a doped polysilicon gate coupled through a contact to a metal gate. The control gates of the transistors 620 and 674 are coupled by respective vias to a metal line which forms the data line datab [7]. The control gate of the transistor 634 is coupled by a via to a metal line which forms the data line data [0]. The control gate of the transistor 688 is coupled by a via to a metal line which forms the data line datab [0]. A break in the middle of FIG. 8 indicates where other n-channel transistors shown in FIG. 6 would have been located in the layout of FIG. 8, but have been removed for purposes of brevity. The n-channel transistors not shown in FIG. 8 for purposes of brevity have substantially the same structure as the n-channel transistors shown in FIG. 8.

Source/drain diffusion regions of the transistors 642 and 690 are formed in two p-type diffusion regions PMOAT 802 and 804 that have been formed in an n-type diffusion region NWELL 806. The transistors 642 and 690 have a common doped polysilicon gate that is coupled to the ground voltage $V_{SS}$ (not shown). The PMOATs 802 and 804 are each formed in two sections on either side of, but not under, the doped polysilicon gate of the transistors 642 and 690. One side of each of the PMOATs 802 and 804 is coupled through a contact to a metal line carrying the supply voltage $V_{CC}$.

Adjacent source/drain diffusion regions in the transistors 620, 634, and 650 are formed in a n-type diffusion region NMOAT 810 that is formed in sections between, but not under, the control gates of the transistors 620, 634, and 650. The NMOAT 810 comprises the coupled line 640 shown in FIG. 6. Similarly, adjacent source/drain diffusion regions in the transistors 672, 674, and 688 are formed in a n-type diffusion region NMOAT 812 that is formed in sections between, but not under, the control gates of the transistors 672, 674, and 688. A metal line carrying the SPT clock signal SPT_CLK is coupled by contacts to the control gates of the transistors 650 and 672, and a metal line carrying the ground voltage $V_{SS}$ 644 is coupled by contacts to the NMOATs 810 and 812 in source/drain diffusion regions of the transistors 650 and 672. The NMOAT 810 is coupled to the PMOAT 802 by contacts and a connecting metal line 820 that has a metal connection 822 to an inverter (not shown). Similarly, the NMOAT 812 is coupled to the PMOAT 804 by contacts and a connecting metal line 830 that has a metal connection 832 to an inverter (not shown). Those skilled in the art will understand that, in view of the layout of the SPT decoder 600 shown in FIG. 8, that the SPT decoder 600 is compact and takes up little space in a substrate.

The separate layers shown in FIG. 8 are listed as follows. The NWELL 806, the NMOATs 810 and 812, and the PMOATs 802 and 804 are separate layers. The doped polysilicon gates of the transistors 620, 634, 642, 650, 672, 674, 688, and 690 are a separate layer. A first metal layer includes the line carrying the SPT clock signal SPT_CLK, the line carrying the ground voltage $V_{SS}$ 644, the line carrying the supply voltage $V_{CC}$, the metal gates of the transistors 620, 634, 674, and 688, the lines 820 and 830, and the connections 822 and 832. Finally, a second metal layer includes the line carrying the ground voltage $V_{SS}$ 644, the line carrying the supply voltage $V_{CC}$, and the data lines data [7], datab [7], data [0], and datab [0].

The control gates of the transistors 620, 634, 674, and 688 can each be connected to one of the data lines data <7:0> or one of the data lines datab <7:0> by using a selected placement of vias. The selection of the location of vias during the fabrication of the SPT decoder 600 determines which test commands will be decoded by the sub-circuits 610 and 612 in the SPT decoder 600, and also determines which sub-circuit, 610 or 612, will decode each test command. This is because the test command recognized and decoded by a sub-circuit to start the generation of an SPT signal is determined by the pattern of connections of the control gates of its n-channel transistors with the data lines data <7:0> and datab <7:0>, as described above.

Figure 9:
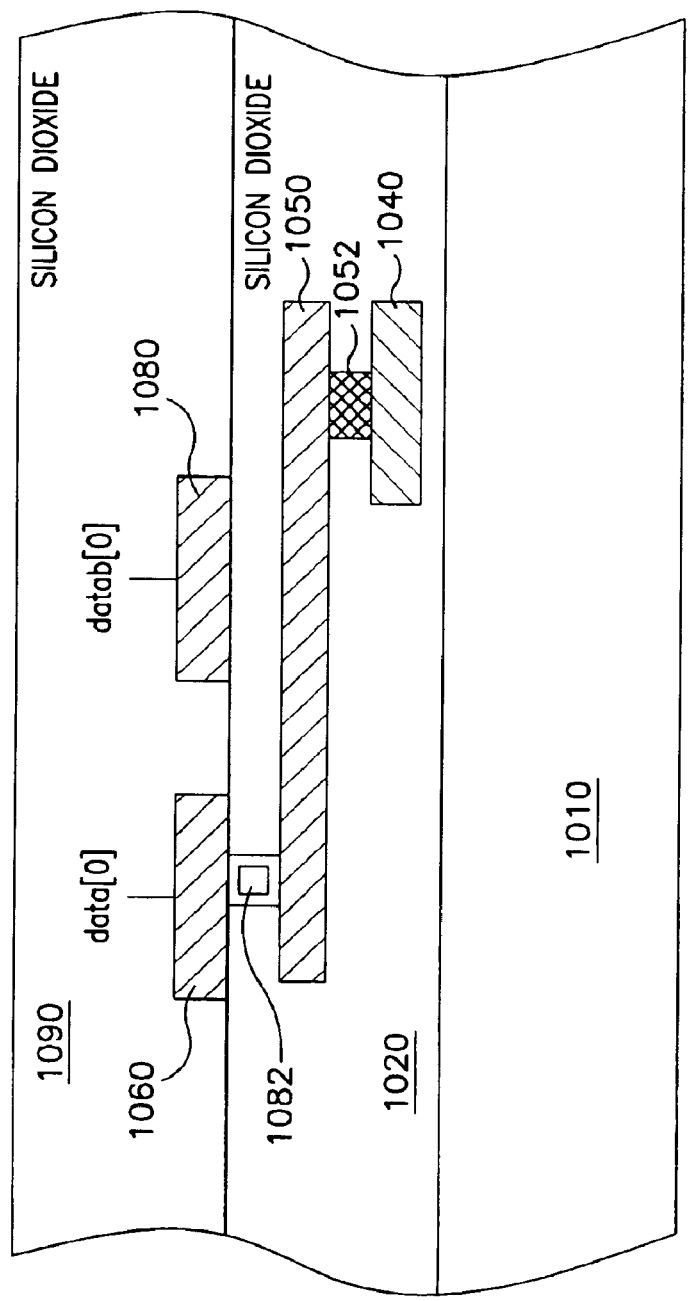
FIG. 9 is a cross-sectional view of a portion of a test mode decoder circuit according to an embodiment of the present invention.

A cross-sectional view 1000 of a portion of the SPT decoder 600 is shown in FIG. 9 according to an embodiment of the present invention. The cross-sectional view 1000 is taken along line 9—9 shown in FIG. 8. Symbols for metal, a via, doped polysilicon, and a contact are shown at the bottom of FIG. 9 and are followed in FIG. 9 to represent those elements without specific reference numerals. The SPT decoder 600 is fabricated with multiple layers on a silicon substrate 1010. The layers shown in FIG. 9 are listed as follows. Layers of silicon dioxide ($SiO_2$) 1020 on the substrate 1010 are placed around a doped polysilicon gate 1040 of the transistor 634 shown in FIG. 8. A metal gate 1050 of the transistor 634 is part of a first metal layer, and is coupled to the doped polysilicon gate 1040 through a contact 1052. A first metal line 1060 forming the data line data [0] and a second metal line 1080 forming the data line datab [0] are part of a second metal layer. A via 1082 is placed in contact with the first metal line 1060 and the metal gate 1050 of the transistor 634 to couple them such that the transistor 634 is switched on or off by a signal on the data line data [0]. The second metal line 1080 is separated from the metal gate 1050 by the layers of silicon dioxide ($SiO_2$) 1020. The removal of the silicon dioxide ($SiO_2$) 1020 and the fabrication of the via 1082 with metal is carried out in a manner known to those skilled in the art. A layer of silicon dioxide ($SiO_2$) 1090 protects the second metal layer and separates the first metal line 1060 from the second metal line 1080.

Figure 10:
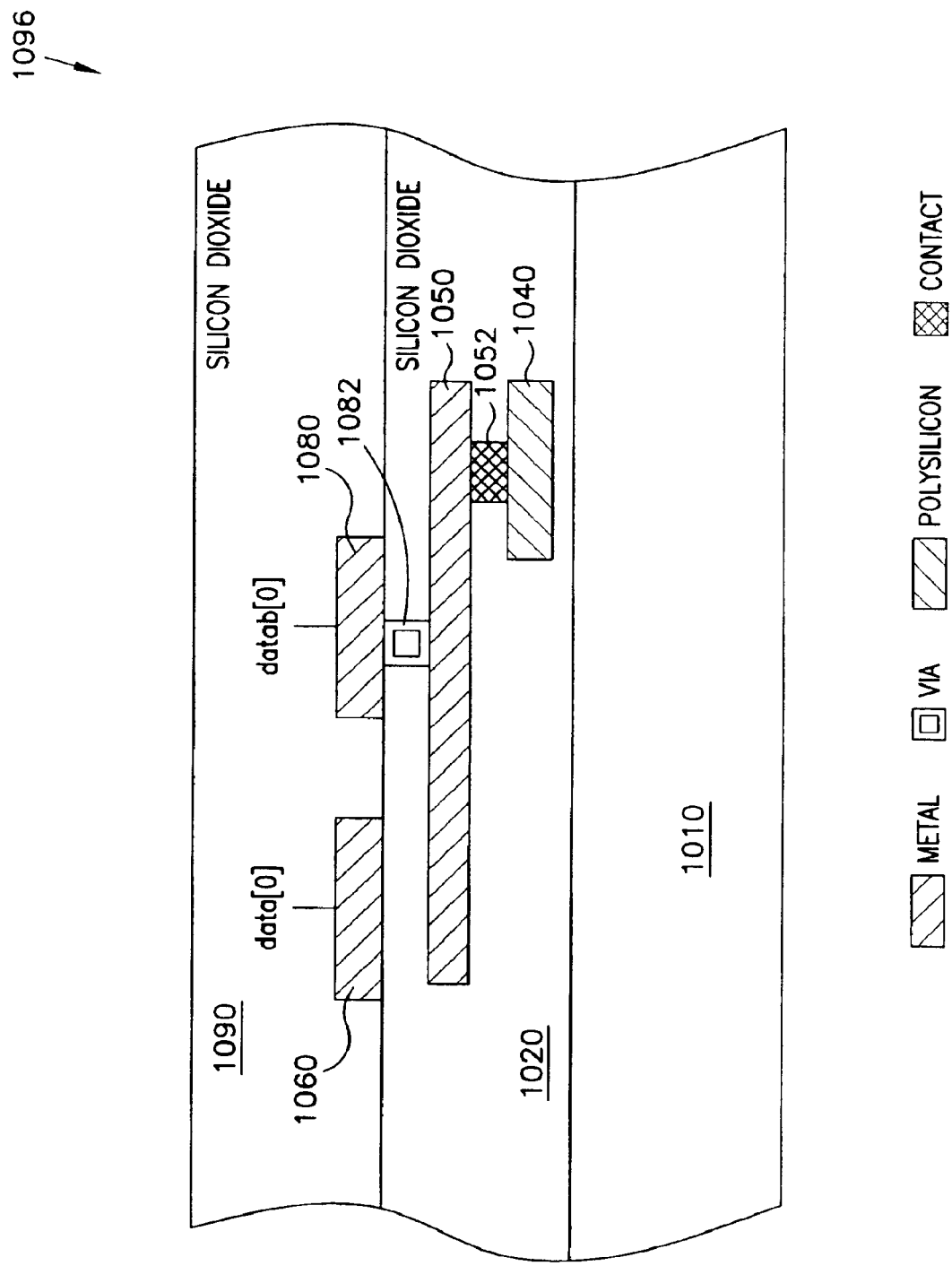
FIG. 10 is a cross-sectional view of a portion of a test mode decoder circuit according to an embodiment of the present invention.

A cross-sectional view 1096 of a portion of the SPT decoder 600 is shown in FIG. 10 according to another embodiment of the present invention. The cross-sectional view 1096 is taken along line 9—9 shown in FIG. 8, and is similar to the cross-sectional view 1000 shown in FIG. 9. Similar elements have been given the same reference numerals, and will not further described herein for purposes of brevity. The cross-sectional view 1096 of FIG. 10 is modified in that the via 1082 is placed in contact with the second metal line 1080 and the metal gate 1050 of the transistor 634 to couple them such that the transistor 634 is switched on or off by a signal on the data line datab [0]. The first metal line 1060 is separated from the metal gate 1050 by the layers of silicon dioxide ($SiO_2$) 1020.

The first metal line 1060 and the second metal line 1080 are located in proximity to the metal gate 1050 such that the via 1082 may be formed between the first metal line 1060 and the metal gate 1050 as shown in FIG. 9, or between the second metal line 1080 and the metal gate 1050 as shown in FIG. 10. More specifically, both the first metal line 1060 and the second metal line 1080 are separated from the metal gate 1050 by a thickness of the silicon dioxide ($SiO_2$) 1020 that is substantially the same as a dimension of the via 1082 to allow the formation of the via 1082 between the first metal line 1060 and the metal gate 1050 as shown in FIG. 9, or between the second metal line 1080 and the metal gate 1050 as shown in FIG. 10. The via 1082 is selectively placed to couple the metal gate 1050 to either the data line data [0] or the data line datab [0]. This selection is made during a fabrication of the SPT decoder 600. With respect to the entire SPT decoder 600, FIGS. 8, 9, and 10 illustrate a flexible placement of vias in the layout of the SPT decoder 600. Corresponding pairs of data lines data <7:0> and datab <7:0> are located in proximity to control gates of multiple n-channel transistors in the SPT decoder 600 to allow for a flexible placement of vias between the data lines data <7:0> and datab <7:0>.

The flexible placement of vias in the layout of the SPT decoder 600 provides for flexibility in several ways. Different systems may use different test commands to carry out the same tests and procedures on the IC 110. The flexible placement of vias permit the SPT decoder 600 to be customized during fabrication to respond to the test commands used by the system it will be coupled to. The flexible placement of vias make the SPT decoder 600 useful in a library of semiconductor circuits that are available for use in a wide range of systems. A circuit designer may select the SPT decoder 600 and choose the location of the vias to make it a useful part of a new system without having to go to the time and expense of designing a new decoder circuit from the ground up. The flexible placement of vias allow the use of fewer sub-circuits in the SPT decoder 600 because they can be modified to recognize different test commands. Without the flexible placement of vias, more sub-circuits would be needed to accommodate a wider range of potential test commands. This advantage contributes to the small, compact size of the SPT decoder 600. Finally, the flexible placement of vias allow for the addition of new test commands to trigger new, additional tests or other events if a test of the SPT decoder 600 reveals the need for such additional measures. This situation occurs during "debugging" of the SPT decoder 600 in a system.

Figure 11:
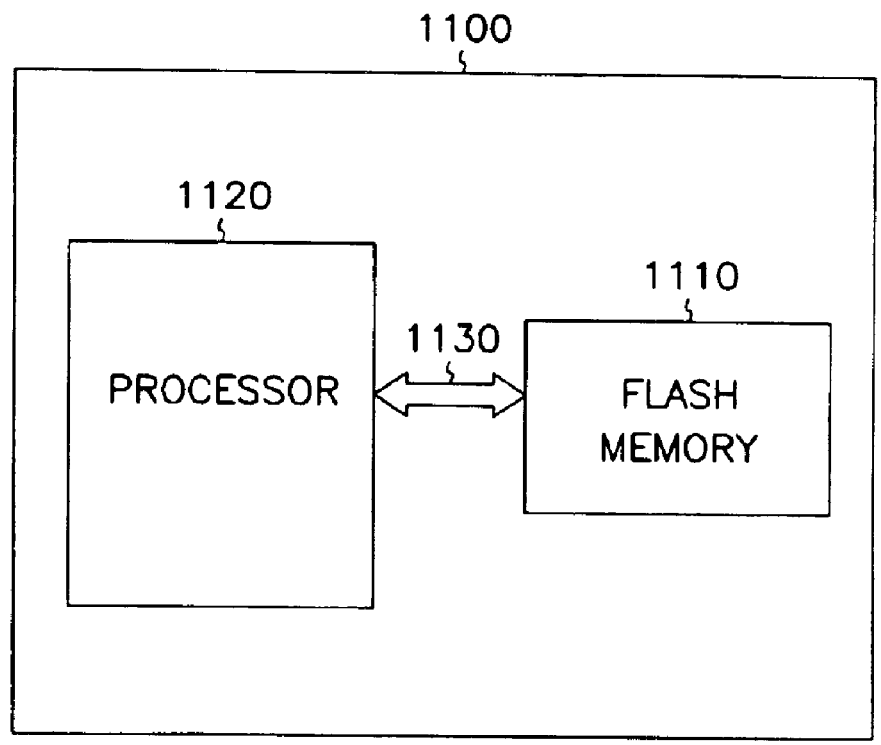
FIG. 11 is a block diagram of an integrated circuit chip according to an embodiment of the present invention.

An integrated circuit chip 1100 according to an embodiment of the present invention is shown in FIG. 11. The chip 1100 includes an embedded flash memory 1110 such as the flash memory integrated circuit (IC) 110, and may include the test mode decoder 400 and one or more of the SPT decoders 600, 714, and 734 according to the embodiments of the present invention described above. The embedded flash memory 1110 shares the chip 1100 with another integrated circuit 1120 such as a processor, or possibly several other integrated circuits. The processor may also include the test mode decoder 400 and one or more of the SPT decoders 600, 714, and 734. The embedded flash memory 1110 and the integrated circuit 1120 are coupled together by a suitable communication line or bus 1130.

Figure 12:
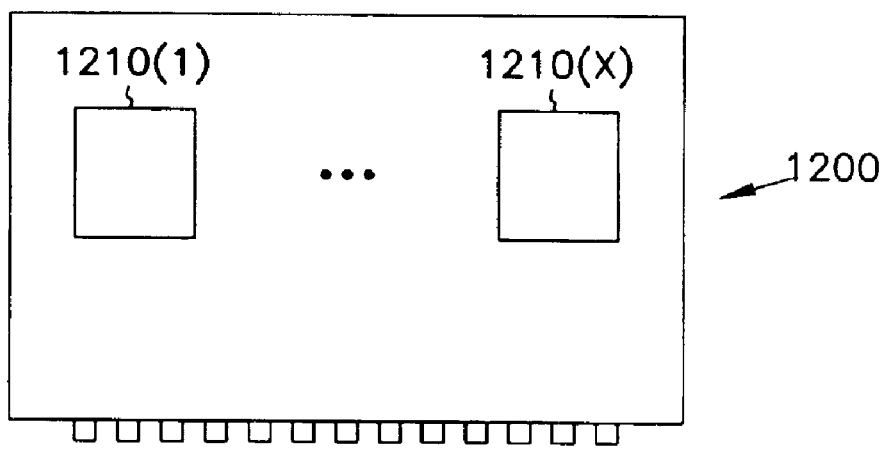
FIG. 12 is block diagram of a compact flash memory card according to an embodiment of the present invention.

One skilled in the art having the benefit of this description will understand that more than one flash memory integrated circuit (IC) 110 according to the embodiments of the present invention described above may be included in various package configurations. For example, a compact flash memory card 1200 according to an embodiment of the present invention is shown in FIG. 12. The card 1200 includes a plurality of flash memory integrated circuits 1210(1)–1210(X) each of which are similar to the flash memory integrated circuit (IC) 110 shown in FIG. 1. The card 1200 may be a single integrated circuit in which the flash memory integrated circuits 1210(1)–1210(X) are embedded.

Figure 13:
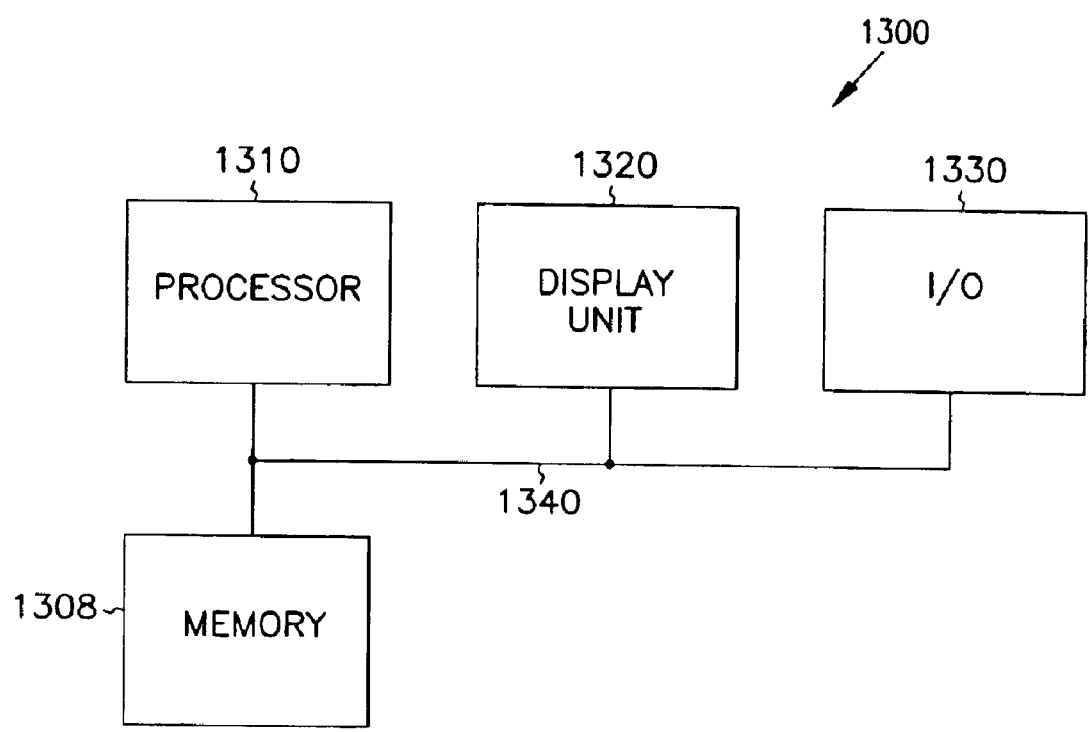
FIG. 13 is a block diagram of an information-handling system according to an embodiment of the present invention. .

FIG. 13 is a block diagram of an information-handling system 1300 according to an embodiment of the present invention. The information-handling system 1300 includes a memory system 1308, a processor 1310, a display unit 1320, and an input/output (I/O) subsystem 1330. The processor 1310 may be, for example, a microprocessor. The memory system 1308 is comprised of the flash memory integrated circuit (IC) 110. The processor 1310 and/or the memory system 1308 may include the test mode decoder 400 and one or more of the SPT decoders 600, 714, and 734 according to the embodiments of the present invention described above. The I/O subsystem 1330 may be a keyboard or other device to allow the user to communicate with the system 1300. The processor 1310 and the memory system 1308 may be embedded on a single integrated circuit chip such as the chip 1100 shown in FIG. 11. The processor 1310, the display unit 1320, the I/O subsystem 1330, and the memory system 1308 are coupled together by a suitable communication line or bus 1340.

In various embodiments of the present invention, the information-handling system 1300 is a computer system (such as, for example, a video game, a hand-held calculator, a television set-top box, a fixed-screen telephone, a smart mobile phone, a personal digital assistant (PDA), a network computer (NC), a hand-held computer, a personal computer, or a multiprocessor supercomputer), an information appliance (such as, for example, a cellular telephone, a pager, or a daily planner or organizer, or any wireless device), an information component (such as, for example, a magnetic disk drive or telecommunications modem), or other appliance (such as, for example, a television, a hearing aid, washing machine or microwave oven having an electronic controller).

Although specific embodiments have been illustrated and described herein, it will be appreciated by those skilled in the art having the benefit of this description that any equivalent arrangement may be substituted for the specific embodiments shown. For example, those skilled in the art having the benefit of this description will understand that the test mode decoder 400 and the SPT decoders 600, 714, and 734 according to the embodiments of the present invention described above may be used in any type of circuit to put that circuit into a special mode and to decode special commands to be used by that circuit. For example, a memory device or a processor may include the test mode decoder 400 and one or more of the SPT decoders 600, 714, and 734 according to the embodiments of the present invention described above. The present invention is therefore limited only by the claims and equivalents thereof.

What is claimed is:

1. An integrated circuit comprising:

first layers of dielectric material formed on a substrate of an integrated circuit;

a control gate formed in the first layers of dielectric material;

a first metal line formed on the first layers of dielectric material and separated from the control gate by a thickness of the dielectric material that is substantially the same as a dimension of a via;

a second metal line formed on the first layers of dielectric material and separated from the control gate by a thickness of the dielectric material that is substantially the same as a dimension of a via; and a via placed between and in contact with the control gate and the first metal line to couple signals between the control gate and the first metal line.

2. The integrated circuit of claim 1 wherein:

the substrate comprises a silicon substrate;

the first layers of dielectric material comprise first layers of silicon dioxide;

the control gate comprises:

a doped polysilicon gate formed in the first layers of dielectric material;

a first metal layer comprising a metal gate formed in the first layers of dielectric material; and a contact formed between the doped polysilicon gate and the metal gate to couple a signal from the metal gate to the doped polysilicon gate;

the via comprises a metal via;

the first metal line and the second metal line comprise a second layer of metal; and further comprising a second layer of silicon dioxide protecting and separating the first metal line from the second metal line.

3. An integrated circuit comprising:

a dielectric material layer formed on a substrate of an integrated circuit;

a control gate formed in the dielectric material layer;

a first metal line formed on the dielectric material layer above the control gate and separated from the control gate by a thickness of the dielectric material;

a second metal line formed on the dielectric material layer above the control gate and separated from the control gate by the thickness of the dielectric material; and a via placed between and in contact with the control gate and one of the first metal line and the second metal line to couple signals between the control gate and the one of the first metal line and second metal line, the via having a dimension substantially the same as the thickness of the dielectric material.

4. The integrated circuit of claim 3, wherein the substrate is a silicon substrate.

5. The integrated circuit of claim 3, wherein the dielectric material is silicon dioxide.

6. The integrated circuit of claim 3, wherein the control gate further comprises:

a doped polysilicon gate formed in the layer of dielectric material;

a metal layer comprising a metal gate formed in the layer of dielectric material; and a contact formed between the doped polysilicon gate and the metal gate to couple a signal from the metal gate to the doped polysilicon gate.

7. The integrated circuit of claim 3, wherein the via includes a metal via.

8. The integrated circuit of claim 3, wherein the first metal line includes a second layer of metal.

9. The integrated circuit of claim 3, wherein the second metal line includes a second layer of metal.

10. The integrated circuit of claim 3, further comprising a second layer of silicon dioxide protecting and separating the first metal line from the second metal line.

11. The integrated circuit of claim 3, wherein the dimension of the via is a height dimension.

12. The integrated circuit of claim 3, wherein the via is selectively placed during fabrication.

13. The integrated circuit of claim 12, wherein the selective placement of the via during fabrication is based on the required test commands to be decoded by the integrated circuit.

14. The integrated circuit of claim 3, wherein the one of the first metal line and the second metal line is coupled to one of an inverted data line and a non-inverted data line.

15. The integrated circuit of claim 14, wherein the integrated circuit is capable of performing a method comprising:
   receiving one of an inverted test command signal and a noninverted test command signal;
   decoding the test signal; and
   generating a decoded signal representing the test command.

16. The integrated circuit of claim 14, wherein the one of the first metal line and the second metal line is configured to receive one of an inverted test command signal and a noninverted test command signal.

17. A system comprising:
   a first integrated circuit; and
   a second integrated circuit operably coupled to the first integrated circuit, the second integrated circuit comprising:
      a dielectric material layer formed on a substrate of an integrated circuit;
      a control gate formed in the dielectric material layer;
      a first metal line formed on the dielectric material layer above the control gate and separated from the control gate by a thickness of the dielectric material;
      a second metal line formed on the dielectric material layer above the control gate and separated from the control gate by the thickness of the dielectric material; and
      a via placed between and in contact with the control gate and one of the first metal line and the second metal line to couple signals between the control gate and the one of the first metal line and second metal line, the via having a dimension substantially the same as the thickness of the dielectric material.

18. The system of claim 17, wherein the first integrated circuit is a processor.

19. The system of claim 17, wherein the second integrated circuit is capable of performing a method comprising:
   receiving one of an inverted test command signal and a noninverted test command signal;
   decoding the test signal; and
   generating a decoded signal representing the test command.

20. The system of claim 17, wherein the system further comprises:
   a further integrated circuit operably coupled to the first integrated circuit, the further integrated circuit comprising:
      a dielectric material layer formed on a substrate of an integrated circuit;
      a control gate formed in the dielectric material layer;
      a first metal line formed on the dielectric material layer above the control gate and separated from the control gate by a thickness of the dielectric material;
      a second metal line formed on the dielectric material layer above the control gate and separated from the control gate by the thickness of the dielectric material; and
      a via placed between and in contact with the control gate and one of the first metal line and the second metal line to couple signals between the control gate and the one of the first metal line and second metal line, the via having a dimension substantially the same as the thickness of the dielectric material.

* * * * *

UNITED STATES PATENT AND TRADEMARK OFFICE
CERTIFICATE OF CORRECTION

PATENT NO. : 6,977,410 B2
DATED : December 20, 2005
INVENTOR(S) : Naso et al.

It is certified that error appears in the above-identified patent and that said Letters Patent is hereby corrected as shown below:

Column 6,
Line 23, delete "100" and insert -- 110 --.

Column 8,
Lines 36 and 58, delete "$t_g$" and insert -- $t_8$ --.

Signed and Sealed this

Seventh Day of March, 2006

JON W. DUDAS
*Director of the United States Patent and Trademark Office*